United States Patent
Qin et al.

(10) Patent No.: US 12,495,636 B2
(45) Date of Patent: Dec. 9, 2025

(54) OPTOCOUPLER

(71) Applicant: KAISTAR Lighting(Xiamen) Co., Ltd., Xiamen (CN)

(72) Inventors: Guo-Heng Qin, Xiamen (CN); Yi-Qun Li, Danville, CA (US); Yeh-Yin Chou, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 396 days.

(21) Appl. No.: 18/119,340

(22) Filed: Mar. 9, 2023

(65) Prior Publication Data

US 2023/0275178 A1    Aug. 31, 2023

(30) Foreign Application Priority Data

Mar. 11, 2022   (WO) ................ PCT/CN2022/080382
Feb. 2, 2023   (CN) .......................... 202310078841.3

(51) Int. Cl.
  *H10F 55/00*   (2025.01)
  *H10F 77/40*   (2025.01)
  *H10F 77/50*   (2025.01)

(52) U.S. Cl.
  CPC ........... *H10F 55/18* (2025.01); *H10F 77/413* (2025.01); *H10F 77/50* (2025.01)

(58) Field of Classification Search
  CPC .. H01L 25/0753; H03K 17/78; H04B 10/802; H10F 55/18; H10F 55/207; H10F 77/413; H10F 77/50; H10H 20/8252
  See application file for complete search history.

(56) References Cited

U.S. PATENT DOCUMENTS

| | | | | | |
|---|---|---|---|---|---|
| 3,881,113 | A | * | 4/1975 | Rideout | ................ H10F 55/255 141/172 |
| 4,766,471 | A | * | 8/1988 | Ovshinsky | ............. H10H 20/00 257/E33.044 |
| 4,851,695 | A | * | 7/1989 | Stein | ....................... H10F 55/25 257/E31.108 |
| 5,150,438 | A | * | 9/1992 | Brown | .................... H10F 55/25 385/39 |
| 6,445,008 | B1 | * | 9/2002 | Lin | ....................... H10F 55/207 257/E25.032 |

(Continued)

FOREIGN PATENT DOCUMENTS

CN    102147512 A    8/2011
CN    108735853 A    11/2018
(Continued)

OTHER PUBLICATIONS

Sabbar et al. ("Design and optimization of high temperature optocouplers as galvanic isolation", Scientific Reports, vol. 12, Issue 1; ISSN 2045-2322, Feb. 9, 2022) (Year: 2022).*

*Primary Examiner* — Andres Munoz
(74) *Attorney, Agent, or Firm* — Zhigang Ma

(57) ABSTRACT

An optocoupler includes a light output chip and a light-sensing chip. A light-receiving surface of the light-sensing chip is disposed to face a light output surface of the light output chip. The light-sensing chip and the light output chip are a green light-emitting diode and a blue light-emitting diode, respectively. Accordingly, the optocoupler has a stable output performance at a working temperature ranging from −55° C. to 150° C. and a high response frequency.

13 Claims, 6 Drawing Sheets

(56) References Cited

U.S. PATENT DOCUMENTS

| | | | | |
|---|---|---|---|---|
| 7,170,099 | B2* | 1/2007 | Noguchi | H01L 25/167 |
| | | | | 438/26 |
| 10,115,714 | B2* | 10/2018 | Takai | H01L 23/49827 |
| 11,525,966 | B2 | 12/2022 | Chao | |
| 2005/0035356 | A1* | 2/2005 | Kek | H01L 25/167 |
| | | | | 438/22 |
| 2014/0284629 | A1* | 9/2014 | Takai | G02B 6/4259 |
| | | | | 257/82 |
| 2015/0263184 | A1* | 9/2015 | Takai | H10H 20/857 |
| | | | | 257/82 |
| 2018/0309522 | A1 | 10/2018 | Chiang et al. | |

FOREIGN PATENT DOCUMENTS

| | | | |
|---|---|---|---|
| CN | 111830647 A | 10/2020 | |
| CN | 113125005 A | 7/2021 | |
| JP | 8116309 A | 5/1996 | |

* cited by examiner

OPTOCOUPLER

CROSS-REFERENCE TO RELATED PATENT APPLICATION

This application claims the benefit of priorities to International Patent Application Ser. No. PCT/CN2022/080382, filed on Mar. 11, 2022, and China Patent Application No. 202310078841.3, filed on Feb. 2, 2023 in People's Republic of China. The entire content of each of the above identified applications is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optocoupler, and more particularly to an optocoupler that utilizes a green light chip.

BACKGROUND OF THE DISCLOSURE

An optocoupler is an optoelectrical converter that transmits an electrical signal via a light beam. Specifically, the optocoupler converts the electrical signal of an input end into an optical signal, and then the optical signal is converted back into the electrical signal after being coupled to an output end. The optocoupler has a good isolation function for the input and output electrical signals, and is thus widely applied for various circuits.

An existing optocoupler adopts an infrared (IR) light-emitting diode as an emitter. In addition, light sensitive devices, such as a diode, a triode, a photoresistor, or an optoelectronic thyristor, can be used as an optical signal receiving and current converting device. In the conventional technology, the material of the infrared light-emitting diode is gallium arsenide (GaAs)-based, and the material of the light sensitive device is silicon-based and germanium-based. Such materials have a poor temperature resistance and are highly sensitive to temperature. Since an output signal varies greatly with the temperature, especially under high temperatures, a maximum working temperature is lower than 110° C., and a response frequency is low (lower than or equal to 100 KHz). Under these circumstances, application-specific circuit requirements (e.g., high-frequency and high-temperature requirements) can no longer be satisfied.

SUMMARY OF THE DISCLOSURE

In response to the above-referenced technical inadequacies, the present disclosure provides an optocoupler, and the optocoupler can be applied to a circuit system that is operated at a high temperature or a high frequency.

In order to solve the above-mentioned problems, one of the technical aspects adopted by the present disclosure is to provide an optocoupler. The optocoupler includes: a light output chip and a light-sensing chip. A light-receiving surface of the light-sensing chip is disposed to face a light output surface of the light output chip. The light-sensing chip and the light output chip are a green light-emitting diode and a blue light-emitting diode, respectively.

In one of the possible or preferred embodiments, the light-sensing chip and the light output chip both have indium atoms, and an indium concentration of the light-sensing chip is greater than or equal to an indium concentration of the light output chip.

In one of the possible or preferred embodiments, an intrinsic capacitance of the light output chip is less than 50 pF.

In one of the possible or preferred embodiments, a wall-plug efficiency (WPE) of the light output chip is greater than or equal to 30% when a current density is 133 mA/mm$^2$.

In one of the possible or preferred embodiments, an intrinsic capacitance of the light-sensing chip is less than 50 pF.

In one of the possible or preferred embodiments, a wall-plug efficiency of the light-sensing chip is greater than or equal to 10% when the current density is 133 mA/mm$^2$.

In one of the possible or preferred embodiments, the light output chip is used to generate a first beam having a first peak wavelength, the light-sensing chip is used to generate a second beam having a second peak wavelength, the first peak wavelength ranges from 420 nm to 500 nm, and the second peak wavelength ranges from 500 nm to 580 nm.

In one of the possible or preferred embodiments, the first peak wavelength ranges from 430 nm to 470 nm, and the second peak wavelength ranges from 500 nm to 545 nm.

In one of the possible or preferred embodiments, a ratio between an area of the light-receiving surface and an area of the light output surface is between 0.2 and 1.5.

In one of the possible or preferred embodiments, the optocoupler further includes a light-permeable layer. The light output chip is disposed below the light-sensing chip along a vertical direction, the light-permeable layer is disposed between the light output chip and the light-sensing chip, and a light transmittance of the light-permeable layer is greater than or equal to 50%.

In one of the possible or preferred embodiments, the optocoupler further includes: an electrical substrate, a conductive wire, an inner package layer, and an outer package layer. The light output chip is disposed on the electrical substrate. One end of the conductive wire is connected to the light-sensing chip, and another end of the conductive wire is connected to the electrical substrate. The inner package layer covers the light output chip, the light-sensing chip, and the conductive wire. The outer package layer covers an outer surface of the inner package layer.

In one of the possible or preferred embodiments, a light reflectivity of the inner package layer is greater than or equal to 50%, and a Shore D hardness of the inner package layer is less than or equal to 60.

In one of the possible or preferred embodiments, a light reflectivity of the outer package layer is greater than or equal to 50%, and a Shore D hardness of the outer package layer is greater than 60.

Therefore, in the optocoupler provided by the present disclosure, by virtue of "the light-sensing chip and the light output chip being a green light-emitting diode and a blue light-emitting diode, respectively," the optocoupler has a stable output performance at a working temperature ranging from −55° C. to 150° C. and a high response frequency.

Further, in the optocoupler provided by the present disclosure, by virtue of "the light output chip and the light-sensing chip using gallium nitride as a main material and both having indium atoms" and "an indium concentration of the light-sensing chip being greater than or equal to an indium concentration of the light output chip," the optocoupler can have a high thermal stability and a high response frequency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
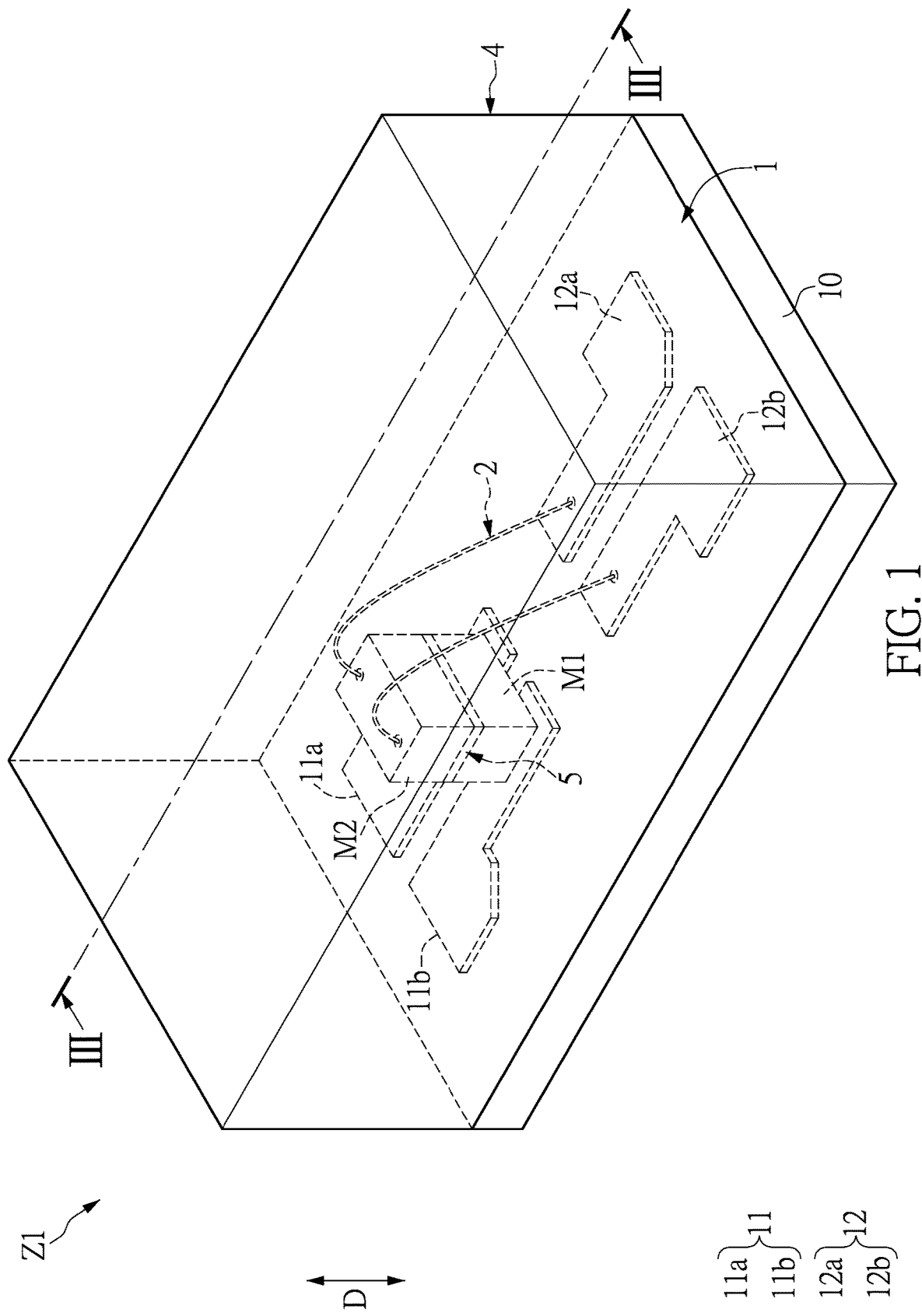
FIG. 1 is a schematic perspective view of an optocoupler according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 2:
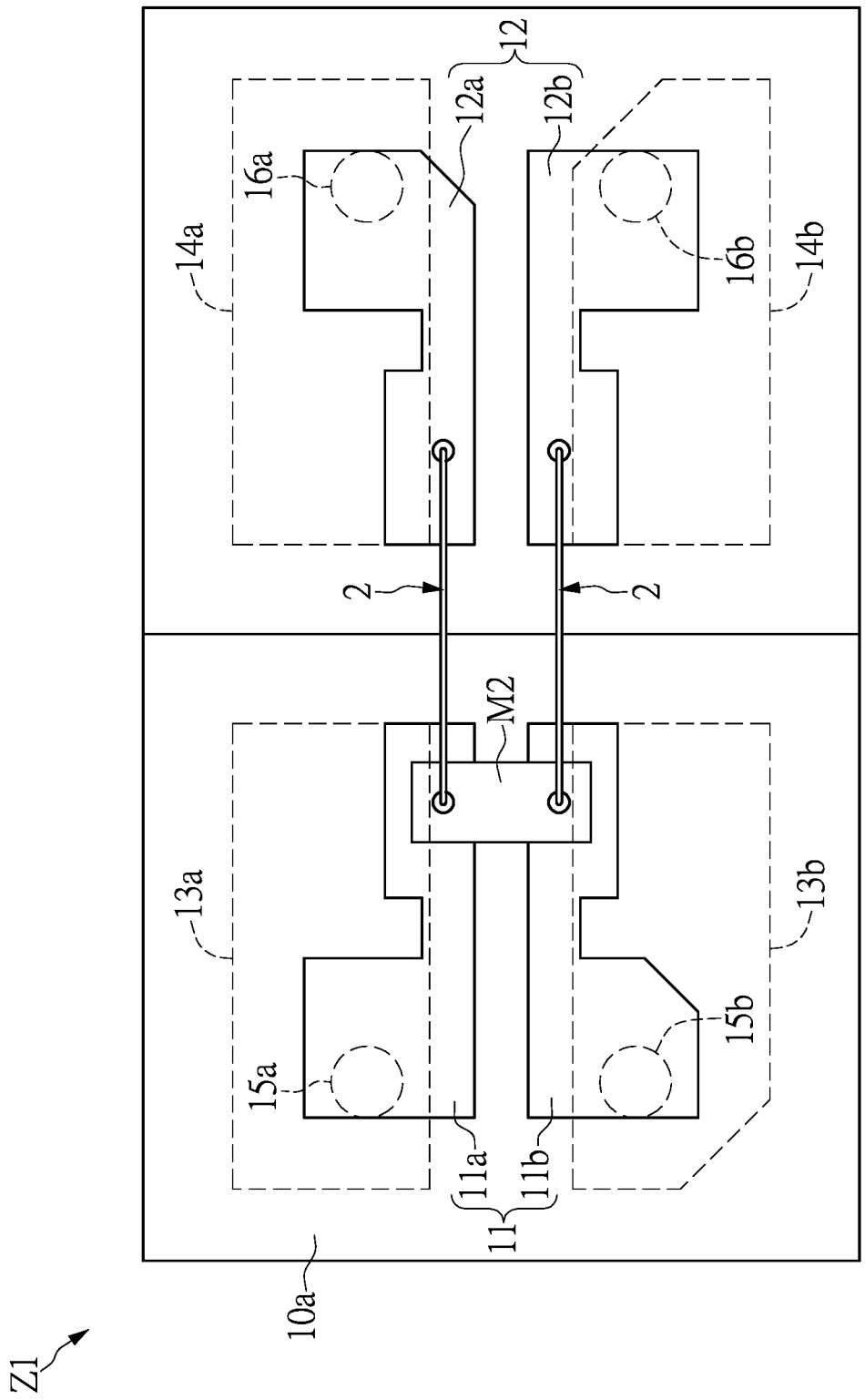
FIG. 2 is a schematic top view of the embodiment shown in FIG. 1 without a cover structure.
Figure 3:
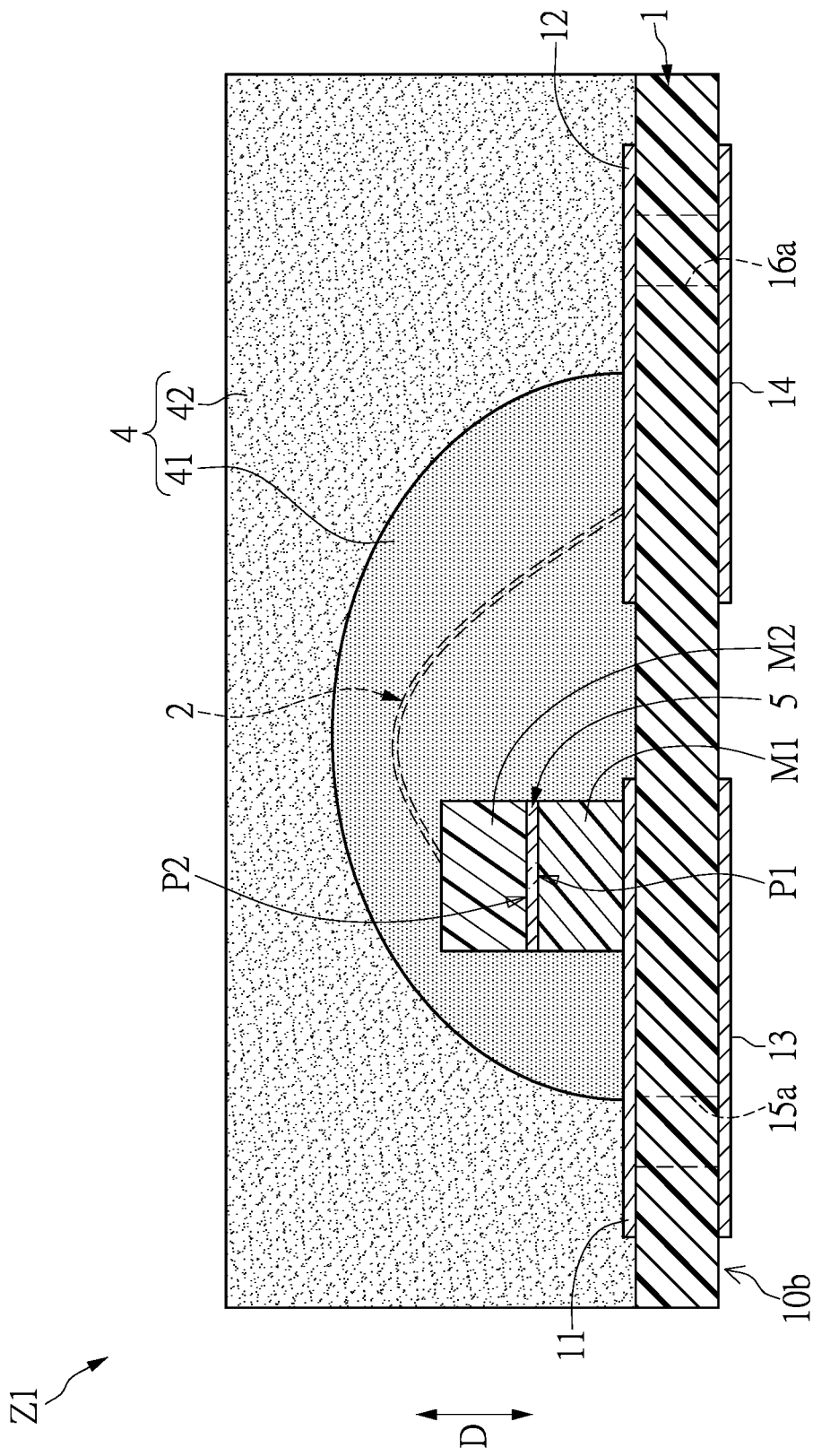
FIG. 3 is a schematic cross-sectional view taken along line 3-3 of FIG. 1.

Reference is made to FIG. 1 to FIG. 3, in which FIG. 1 is a schematic perspective view of an optocoupler Z1 according to one embodiment of the present disclosure, FIG. 2 is a schematic top view of the embodiment shown in FIG. 1 without a cover structure 4, and FIG. 3 is a schematic cross-sectional view taken along line 3-3 of FIG. 1.

The optocoupler Z1 includes a light output chip M1, a light-sensing chip M2, an electrical substrate 1, a conductive wire 2, and the cover structure 4. The light output chip M1 is disposed on the electrical substrate 1. One end of the conductive wire 2 is connected to the light-sensing chi M2, and another end of the conductive wire 2 is connected to the electrical substrate 1. The cover structure 4 includes an inner package layer 41 and an outer package layer 42. The inner package layer 41 covers the light output chip M1, the light-sensing chip M2, and the conductive wire 2. The outer package layer 42 covers an outer surface of the inner package layer 41. A light-receiving surface P2 of the light-sensing chip M2 is disposed to face a light output surface P1 of the light output chip M1.

The electrical substrate 1 can be, for example, a circuit board or a support. In the embodiment shown in FIG. 1, the electrical substrate 1 is the circuit board, and can be a single-layer wiring board or a multilayer wiring board. The electrical substrate 1 includes an insulating layer 10, a first pad assembly 11, a second pad assembly 12, a first electrode assembly 13, and a second electrode assembly 14 (as shown in FIG. 2). In one embodiment, the material of the insulating layer 10 can be selected from ceramics, an epoxy resin-fiberglass material (FR4), bismaleimide-triazine (BT) resins, etc. Preferably, through material selection and cooperation, the material of the insulating layer 10 has a dielectric constant less than or equal to 10. Accordingly, a capacitance of the optocoupler Z1 can be decreased, which is beneficial for increasing a response frequency. The ceramics can be, for example, aluminum oxide ($Al_2O_3$) or aluminum nitride (AlN). However, the present disclosure is not limited thereto.

As shown in FIG. 2 and FIG. 3, the insulating layer 10 has a first side 10a and a second side 10b along a vertical direction D, and the second side 10b is opposite to the first side 10a. The first pad assembly 11 and the second pad assembly 12 are disposed on the first side 10a of the insulating layer 10, and are spaced apart from each other. In the present embodiment, the first pad assembly 11 includes two first pads 11a, 11b, and the second pad assembly 12 includes two second pads 12a, 12b. The first electrode assembly 13 and the second electrode assembly 14 are disposed on the second side 10b of the insulating layer 10, and are spaced apart from each other. In the present embodiment, the first electrode assembly 13 includes a first positive electrode 13a and a first negative electrode 13b. Through two first conductive pillars 15a, 15b, the first positive electrode 13a and the first negative electrode 13b are respectively and electrically connected to the two first pads 11a, 11b. The second electrode assembly 14 includes a second positive electrode 14a and a second negative electrode 14b. Through two second conductive pillars 16a, 16b, the second positive electrode 14a and the second negative electrode 14b are respectively and electrically connected to the two second pads 12a, 12b. In this way, the optocoupler Z1 can be electrically connected to an external circuit through the first electrode assembly 13 and the second electrode assembly 14.

The light output chip M1 is disposed on the electrical substrate 1, and is disposed below the light-sensing chip M2 along the vertical direction D. The light output chip M1 and the light-sensing chip M2 can be chips that have a horizontal structure. In this embodiment, a surface of the light output chip M1 that faces the light-sensing chip M2 is defined as the light output surface P1, and a surface of the light-sensing chip M2 that faces the light output surface P1 is defined as the light-receiving surface P2. The light output chip M1 is preferably a flip chip that has a reflective structure, such that light emitted by the light output chip M1 can be mostly projected outward from the light output surface P1. In this way, a current conversion efficiency can be improved. An output current (Ioutput) of the optocoupler Z1 divided by an input current (Iinput) of the optocoupler Z1 (i.e., Ioutput/Iinput) equals the current conversion efficiency. The light-sensing chip M2 can be a wire-bonding chip or a flip chip, and is not limited in the present disclosure. In this embodiment, the optocoupler Z1 further includes a light-permeable layer 5. The light-permeable layer 5 is disposed between the light output chip M1 and the light-sensing chip M2, and a light transmittance of the light-permeable layer 5 is greater than or equal to 50%. The light-permeable layer 5 allows a first beam generated by the light output chip M1 to pass there-through. In some embodiments, the material of the light-permeable layer 5 can be, but is not limited to, resins.

It should be noted that each of the light output chip M1 and the light-sensing chip M2 is essentially a light-emitting chip. The light output chip M1 is different from the light-sensing chip M2 in terms of function and a light-emitting wavelength range. For example, in the embodiment of the present disclosure, the light-sensing chip M2 is used for receiving light and not used for emitting light.

The conductive wire 2 can be, for example, a metal conductive wire. In one embodiment, the conductive wire 2 is a copper (Cu) wire. As shown in FIG. 1, through the two conductive wires 2, two electrodes of the light-sensing chip M2 can be respectively and electrically connected to the two second pads 12a, 12b.

In some embodiments, the material of the inner package layer 41 is a gel material (which can be, for example but not limited to, epoxy resins or silicon resins that contain powders of aluminum oxide ($Al_2O_3$) or barium sulfate ($BaSO_4$)). Such a material has a high heat resistance, a low dielectric constant, and a high reflectivity. A light reflectivity of the inner package layer 41 is greater than or equal to 50%, and a Shore D hardness of the inner package layer 41 is less than or equal to 60, so as to prevent breakage of the conductive wire 2 (which can be caused by applying excessive stress thereon). The inner package layer 41 covers and protects the conductive wire 2, the light output chip M1, and the light-sensing chip M2, and can reduce loss of light for improving the input and output current conversion efficiency.

In some embodiments, the material of the outer package layer 42 is a gel material (which can be, for example but not limited to, epoxy resins or silicon resins that contain powders of aluminum oxide ($Al_2O_3$) or barium sulfate ($BaSO_4$)). Such a material has a high heat resistance, a low dielectric constant, and a high reflectivity. A light reflectivity of the outer package layer 42 is greater than or equal to 50%, and a Shore D hardness of the outer package layer 42 is greater than 60, so as to protect the inner package layer 41. The outer package layer 42 is configured to enhance a mechanical performance of the optocoupler Z1, reduce the loss of light, and improve the current conversion efficiency.

In the present embodiment, the main functional material of the light output chip M1 and the light-sensing chip M2 is gallium nitride (GaN). Compared with chips formed by materials such as gallium arsenide, silicon, and germanium, a gallium nitride chip has an improved heat resistance and an improved thermal stability, thereby allowing the optocoupler Z1 to be operable at a high ambient temperature. In addition, the light output chip M1 and the light-sensing chip M2 are both GaN-based light-emitting diode chips, and have indium (In) atoms (i.e., containing an InGaN compound). In the embodiment shown in FIG. 1, an indium concentration of the light-sensing chip M2 is greater than or equal to an indium concentration of the light output chip M1. A more detailed description will be provided below.

The light output chip M1 is disposed on the electrical substrate 1 in an inverted (or flipped) manner, and an electrical connection is formed between the light output chip M1 and the first pad assembly 11. The light-sensing chip M2 is electrically connected to the electrical substrate 1 in an upright (or wire-bonding) manner, and an electrical connection is formed between the light-sensing chip M2 and the second pad assembly 12.

In one embodiment of the present disclosure, a blue light-emitting diode is selected for use as the light output chip M1, and a green light-emitting diode is selected for use as the light-sensing chip M2. The blue light-emitting diode and the green light-emitting diode that are selected for use are both GaN-based light-emitting diodes, which allows the optocoupler Z1 to have a stable output performance at a working temperature ranging from −55° C. to 150° C. Based on selection of the light-emitting diode, an improved current conversion efficiency and an improved response frequency can be achieved in the present disclosure. Specifically, the response frequency of the optocoupler Z1 can reach 10 MHz, and the current conversion efficiency of the optocoupler Z1 can reach 20%.

It is worth mentioning that, by using the GaN-based light-emitting diodes as the light output chip M1 and the light-sensing chip M2, the optocoupler Z1 of the present embodiment can not only be used for uni-directional signal transmission, but can also be used for bi-directional signal transmission. That is, an electrical signal can be provided to the light output chip M1, such that the light output chip M1 emits a blue light. Then, the light-sensing chip M2 receives and converts the blue light into the electrical signal, so as to carry out forward signal transmission. An electrical signal can also be provided to the light-sensing chip M2, such that the light-sensing chip M2 emits a green light. Then, the light-sensing chip M2 receives and converts the green light into the electrical signal, so as to carry out reverse signal transmission. In the reverse signal transmission, the light-sensing chip M2 can be considered to be used as a light output chip, and the light output chip M1 can be considered to be used as a light-sensing chip.

The light output chip M1 can generate the first beam having a first peak wavelength, the light-sensing chip M2 can generate a second beam having a second peak wavelength, the first peak wavelength ranges from 420 nm to 500 nm (the blue light), and the second peak wavelength ranges from 500 nm to 580 nm (the green light). Here, the indium concentration of the light output chip M1 ranges between 10.7 mol % and 23.2 mol %, and the indium concentration of the light-sensing chip M2 ranges between 23.2 mol % and 33.3 mol %. In one embodiment of the present disclosure, the first peak wavelength of the first beam generated by the light output chip M1 can selectively range from 430 nm to 470 nm, and the light-sensing chip M2 in the optocoupler Z1 is used for receiving optical information (not for emitting light). However, in some embodiments, the second peak wavelength of the second beam generated by the light-sensing chip M2 can range from 500 nm to 545 nm, which is applicable for bi-directional transmission. The light-sensing chip M2 can generate the green light and transmits the optical information to the light output chip M1. In some embodiments, the indium concentration of the light output chip M1 ranges between 12.4 mol % and 18.8 mol %, and the indium concentration of the light-sensing chip M2 ranges between 23.2 mol % and 29.1 mol %.

In the present disclosure, a light-emitting diode chip that has an intrinsic capacitance less than 50 pF is preferably selected as the light output chip M1, so as to aid in increasing the response frequency of the optocoupler Z1. The light output chip M1 can selectively be a light-emitting diode chip that has a wall-plug efficiency (WPE) greater than or equal to 30% when a current density is 133 mA/mm$^2$ This is beneficial for improving the current conversion efficiency of the optocoupler Z1. Similarly, the light-emitting diode chip that has an intrinsic capacitance less than 50 pF is preferably selected as the light-sensing chip M2. The light-sensing chip M2 can selectively be a light-emitting diode chip that has a wall-plug efficiency (WPE) greater than or equal to 10% when the current density is 133 mA/mm$^2$ In this way, the response frequency of the optocoupler Z1 can be further ensured to reach 10 MHz, and the current conversion efficiency can achieve 20%.

In one embodiment of the present disclosure, it is preferable for a ratio between an area of the above-mentioned light-receiving surface P2 and an area of the above-mentioned light output surface P1 to be greater than or equal to 1, so that the optocoupler Z1 can have a high current conversion efficiency and a high response frequency. However, in a practical application, factors including the wall-plug efficiency of each of the light output chip M1 and the light-sensing chip M2, chip costs, requirements for the current conversion efficiency of the optocoupler Z1, and the need for bi-directional transmission of optical coupling are taken into consideration. As such, the ratio between the area of the above-mentioned light-receiving surface P2 and the area of the above-mentioned light output surface P1 can be between 0.2 and 1.5.

Figure 4:
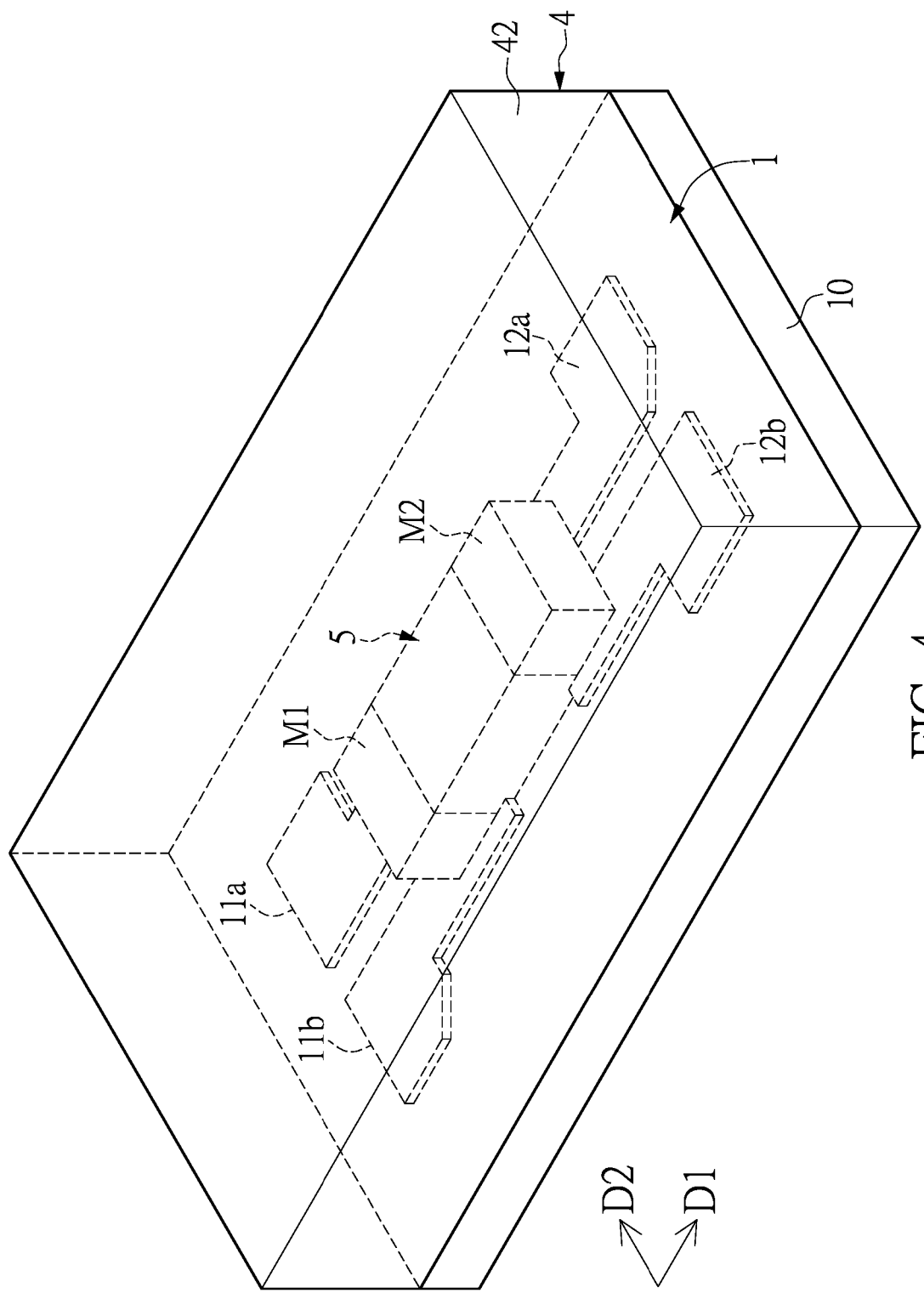
FIG. 4 is a schematic perspective view of the optocoupler according to another embodiment of the present disclosure.

Reference is made to FIG. 4, which is a schematic perspective view of an optocoupler Z2 according to another embodiment of the present disclosure. In the present embodiment, a first chip M1 and a second chip M2 are disposed on the electrical substrate 1. One of the first chip M1 and the second chip M2 is the light output chip, and another one of the first chip M1 and the second chip M2 is the light-sensing chip. When the first chip M1 is the light output chip, the second chip M2 is the light-sensing chip. When the second chip M2 is the light output chip, the first light chip M1 is the light-sensing chip.

In the present embodiment, the first chip M1 and the second chip M2 are disposed on the electrical substrate 1 via the first pad assembly 11 and the second pad assembly 12, respectively. The first chip M1 and the second chip M2 can be chips that have a horizontal structure or chips that have a vertical structure, and are not limited in the present disclosure.

Further, the first chip M1 and the second chip M2 are disposed on the electrical substrate 1 in a parallel manner, and are spaced apart from each other by a gap. In the present embodiment, the first chip M1 is disposed on the electrical substrate 1 with its back side facing upward, and the second chip M2 is also disposed on the electrical substrate 1 with its back side facing upward.

In the present embodiment, a side surface of the first chip M1 that has a largest area faces toward the second chip M2. Similarly, a side surface of the second chip M2 that has a largest area also faces toward the first chip M1. When the first chip M1 is the light output chip and the second chip M2 is the light-sensing chip, the side surface of the first chip M1 is used as a light output surface, and the side surface of the second chip M2 is used as a light-receiving surface.

In the present embodiment, the first chip M1 and the second chip M2 have a rectangular shape from a top view perspective. From a top view, a long side of the first chip M1 is approximately parallel to a long side of the second chip M2 along a second direction D2, and the first chip M1 and the second chip M2 are aligned with each other along a first direction D1. Accordingly, most of a light beam generated from the light output surface (the side surface of the first chip M1) enters the light-receiving surface (the side surface of the second chip M2), thereby improving the current conversion efficiency. An output current (Ioutput) of the optocoupler Z2 divided by an input current (Iinput) of the optocoupler Z2 (i.e., Ioutput/Iinput) equals the current conversion efficiency. It is worth mentioning that the first chip M1 and the second chip M2 of the present embodiment face each other by the side surfaces having the largest area, and are aligned with each other along the first direction D1, but the present disclosure is not limited thereto.

In the present embodiment, the main functional material forming the first chip M1 and the second chip M2 is gallium nitride. That is to say, each of the first chip M1 and the second chip M2 is the gallium nitride chip. Compared with the chips formed by materials such as gallium arsenide, silicon, and germanium, the gallium nitride chip has an improved heat resistance and an improved thermal stability, thereby allowing the optocoupler Z2 to be operable at a high ambient temperature.

Figure 5:
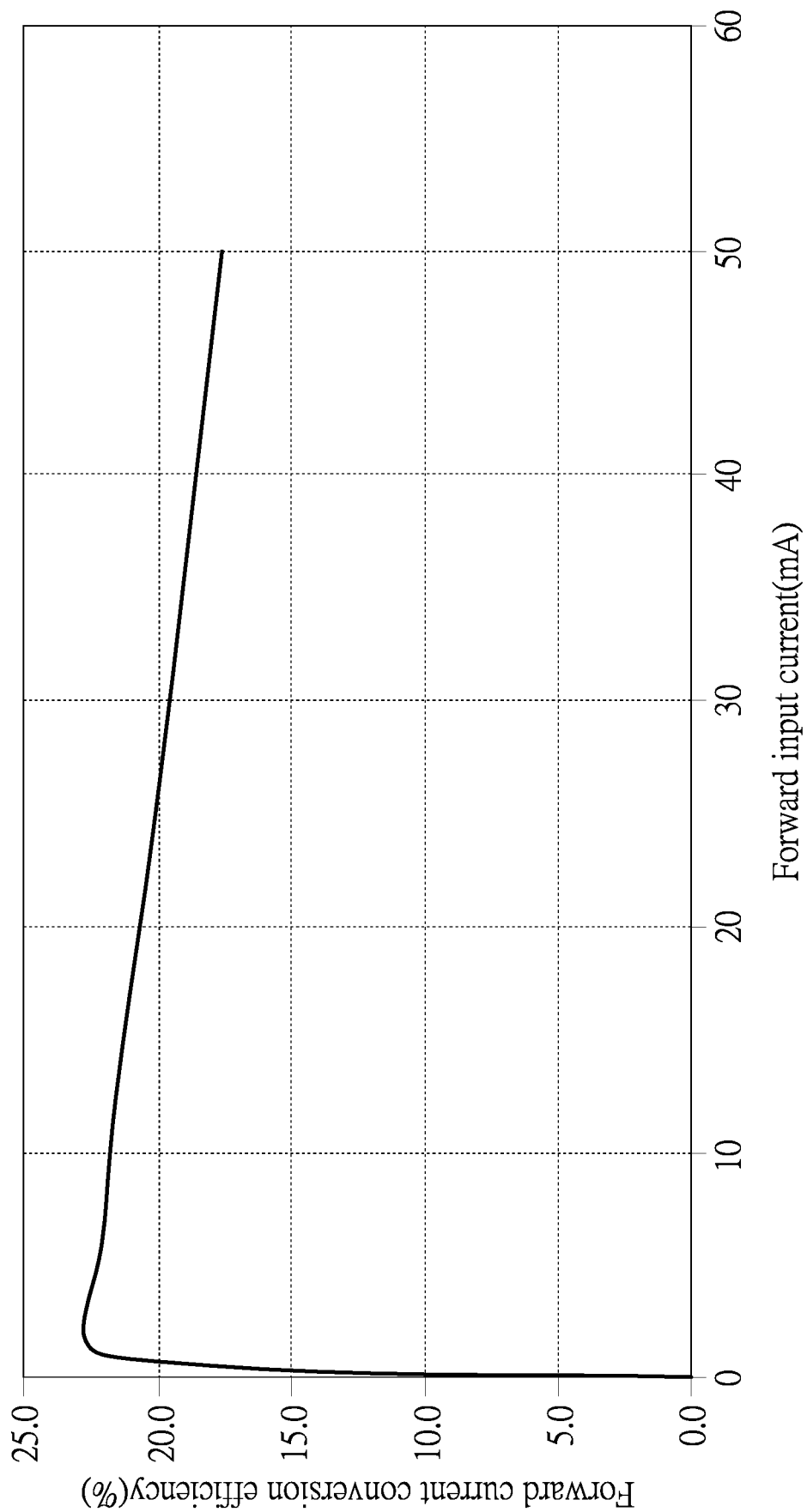
FIG. 5 is a curve diagram showing a forward current conversion efficiency versus a forward input current of the optocoupler according to one embodiment of the present disclosure.

Reference is made to FIG. 5, which is a curve diagram showing a forward current conversion efficiency versus a forward input current of the optocoupler Z1 according to the embodiment shown in FIG. 1. FIG. 5 illustrates results obtained by measuring the optocoupler Z1 at a temperature of 25° C. In this embodiment, the current conversion efficiency of the optocoupler Z1 can, for example, reach 20% when the input current is from 2 mA to 26 mA. As for a conventional infrared optocoupler, its current conversion efficiency only ranges from 0.02% to 0.1%. In response to a current change, the current conversion efficiency has a gentle downward trend. This indicates that the input current has little influence on the forward current conversion efficiency, and that the optocoupler Z1 of the present disclosure has a high stability.

Figure 6:
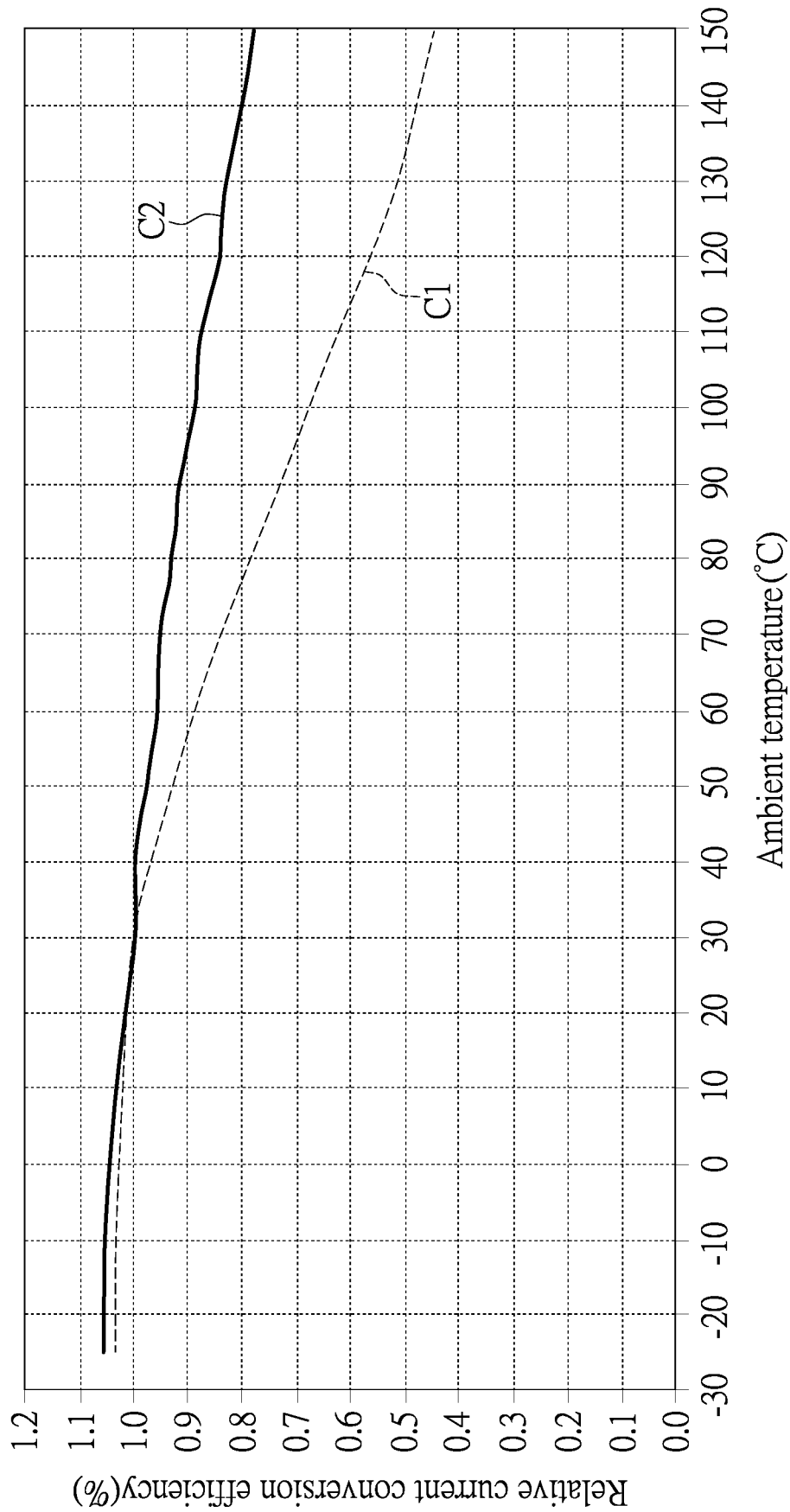
FIG. 6 shows a relative current conversion efficiency of the optocoupler in an exemplary embodiment of the present disclosure and a comparative example at different ambient temperatures.

Reference is made to FIG. 6, which shows a relative current conversion efficiency of the optocoupler in an exemplary embodiment and a comparative example at different ambient temperatures. A curve C1 represents the relative current conversion efficiency in the comparative example at different ambient temperatures. A curve C2 represents the relative current conversion efficiency in the present embodiment at different ambient temperatures. In the comparative example, the conventional infrared optocoupler is used, and the main chip material thereof is gallium arsenide.

When the current conversion efficiencies of the comparative example and the present embodiment are measured at each ambient temperature, the input current is set to be 5 mA. In addition, the current conversion efficiencies of the comparative example and the present embodiment measured at each ambient temperature are normalized relative to current conversion efficiencies obtained when the input current is 5 mA and the ambient temperature is 25° C. As shown in FIG. 6, the relative current conversion efficiency of the optocoupler Z1 in the present embodiment does not vary significantly with changes of the ambient temperature.

When the working temperature is gradually increased to 150° C., the current conversion efficiency of the optocoupler Z1 in the present disclosure remains above 75% of a room temperature. In contrast, the relative current conversion efficiency of the infrared optocoupler in the comparative example is already decreased to 0.6 when the input current is 5 mA and the ambient temperature is 110° C. That is to say, when the ambient temperature is 110° C., the current conversion efficiency of the comparative example is already reduced to 60% of its referential current conversion efficiency. When the ambient temperature is 150° C., the relative current conversion efficiency of the comparative example is already decreased to 0.45.

Based on the above, the optocoupler Z1 provided in the embodiment of the present disclosure has a higher thermal stability. Even when the optocoupler Z1 is operated at an ambient temperature of 150° C., the current conversion efficiency can still remain at 75% or more of its referential current conversion efficiency.

Beneficial Effects of the Embodiments

In conclusion, in the optocoupler provided by the present disclosure, by virtue of "the light-sensing chip and the light output chip being a green light-emitting diode and a blue light-emitting diode, respectively," the optocoupler has a stable output performance at the working temperature ranging from −55° C. to 150° C. and a high response frequency.

Further, in the optocoupler provided by the present disclosure, by virtue of "the light output chip and the light-sensing chip using gallium nitride as a main material and both having indium atoms" and "an indium concentration of the light-sensing chip being greater than or equal to an indium concentration of the light output chip," the optocoupler can have a high thermal stability and a high response frequency.

In one further embodiment of the present disclosure, the indium concentration of the light output chip ranges between 12.4 mol % and 18.8 mol %, and the first peak wavelength of the first beam generated by the light output chip ranges from 430 nm to 470 nm. The light output chip has properties of a high thermal stability, a high wall-plug efficiency, and a fast response speed. In some embodiments, the indium concentration of the light-sensing chip ranges between 23.2 mol % and 29.1 mol %. When being used as the light-emitting chip, the second peak wavelength of the second beam generated by the light-sensing chip ranges from 500 nm to 545 nm. When being used for receiving light, the light-sensing chip has properties of a high absorption and conversion efficiency with respect to a band range of from 430 nm to 480 nm, a high thermal stability, and a fast response speed. The optocoupler configured in this manner has a stable output at the working temperature ranging from −55° C. to 150° C. and a response frequency greater than or equal to 10 MHz.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optocoupler, comprising:
an electrical substrate, including an insulating layer, a first pad assembly, a second pad assembly, a first electrode assembly, and a second electrode assembly; wherein the first pad assembly and the second pad assembly are disposed on a first side of the insulating layer and are spaced apart from each other, the first electrode assembly and the second electrode assembly are disposed on an opposite second side of the insulating layer, the first electrode assembly is electrically connected to the first pad assembly through first conductive pillars, the second electrode assembly is electrically connected to the second pad assembly through second conductive pillars, the first pad assembly comprises two first pads spaced apart from each other, and the second pad assembly comprises two second pads spaced apart from each other;
a blue-emitting diode, acting as a light output chip, wherein the blue-emitting diode has a horizontal structure and is disposed on the two first pads of the electrical substrate in a flipped manner to form an electrical connection with the two first pads, wherein the two first pads are located between the insulting layer and the blue-emitting diode;
a green-emitting diode, acting as a light-sensing chip, wherein a light-receiving surface of the green-emitting diode is disposed to face a light output surface of the blue-emitting diode, and the green-emitting diode has a horizontal structure and is stacked on the blue-emitting diode; and
two conductive wires, wherein two electrodes of the light-sensing chip are electrically connected to the two second pads through the two conductive wires.

2. The optocoupler according to claim 1, wherein an intrinsic capacitance of the light output chip is less than 50 pF.

3. The optocoupler according to claim 1, wherein a wall-plug efficiency of the light output chip is greater than or equal to 30% when a current density is 133 mA/mm2.

4. The optocoupler according to claim 1, wherein the blue-emitting diode is used to generate a first beam having a first peak wavelength, the green-emitting diode is used to generate a second beam having a second peak wavelength, the first peak wavelength ranges from 420 nm to 500 nm, and the second peak wavelength ranges from 500 nm to 580 nm.

5. The optocoupler according to claim 4, wherein the first peak wavelength ranges from 430 nm to 470 nm, and the second peak wavelength ranges from 500 nm to 545 nm.

6. The optocoupler according to claim 1, wherein a ratio between an area of the light-receiving surface and an area of the light output surface is between 0.2 and 1.5.

7. The optocoupler according to claim 1, further comprising a light-permeable layer, wherein the light output chip is disposed below the light-sensing chip along a vertical direction, the light-permeable layer is disposed between the light output chip and the light-sensing chip, and a light transmittance of the light-permeable layer is greater than or equal to 50%.

8. The optocoupler according to claim 7, further comprising:
an inner package layer covering the light output chip, the light-sensing chip, the light-permeable layer, and the two conductive wires; and an outer package layer covering an outer surface of the inner package layer.

9. The optocoupler according to claim 8, wherein a light reflectivity of the inner package layer is greater than or equal to 50%, and a Shore D hardness of the inner package layer is less than or equal to 60 so as to prevent breakage of the two conductive wires; and
wherein a light reflectivity of the outer package layer is greater than or equal to 50%, and a Shore D hardness of the outer package layer is greater than 60 so as to protect the inner package layer.

10. The optocoupler according to claim 1, wherein an indium concentration of the green-emitting diode is greater than or equal to an indium concentration of the blue-emitting diode.

11. The optocoupler according to claim 1, wherein an indium concentration of the blue-emitting diode ranges between 12.4 mol % and 18.8 mol %, and the blue-emitting diode is configured to generate a first beam having a first peak wavelength from 430 nm to 470 nm; and
wherein an indium concentration of the green-emitting diode ranges between 23.2 mol % and 29.1 mol %, and the green-emitting diode is configured to generate a second beam having a second peak wavelength from 500 nm to 545 nm.

12. An optocoupler, comprising:
an electrical substrate, including an insulating layer, a first pad assembly, a second pad assembly, a first electrode assembly, and a second electrode assembly; wherein the first pad assembly and the second pad assembly are disposed on a first side of the insulating layer and are spaced apart from each other, the first electrode assembly and the second electrode assembly are disposed on an opposite second side of the insulating layer, the first electrode assembly is electrically connected to the first pad assembly, the second electrode assembly is electrically connected to the second pad assembly, the first pad assembly comprises two first pads spaced apart from each other, and the second pad assembly comprises two second pads spaced apart from each other;
a light output chip, having a horizontal structure and disposed on the two first pads of the electrical substrate in a flipped manner to form an electrical connection with the two first pads, wherein the two first pads are located between the insulting layer and the light output chip; and
a light-sensing chip, having a horizontal structure and stacked on the light output chip, wherein a light-receiving surface of the light-sensing chip is disposed to face towards a light output surface of the light output chip, the light output chip is one of a blue light-emitting diode and a green light-emitting diode, and the light-sensing chip is the other one of the blue light-emitting diode and the green light-emitting diode;
conductive wires, wherein two electrodes of the light-sensing chip are electrically connected to the two second pads through the conductive wires;
a light permeable layer, sandwiched between the light output surface of the light output chip and the light-receiving surface of the light-sensing chip, wherein a material of the light permeable layer is a resin; and
a cover structure, disposed to cover the light output chip, the light-sensing chip, the light permeable layer, and the conductive wires.

13. The optocoupler according to claim 12, wherein the cover structure comprises:
an inner package layer covering the light output chip, the light-sensing chip, the light permeable layer, and the conductive wires; and
an outer package layer covering an outer surface of the inner package layer;
wherein a Shore D hardness of the inner package layer is less than or equal to 60, so as to prevent breakage of the conductive wires; and a Shore D hardness of the outer package layer is greater than 60, so as to protect the inner package layer.

* * * * *